United States Patent [19]

Pezzolo

[11] 3,914,622

[45] Oct. 21, 1975

[54] LATCH CIRCUIT WITH NOISE SUPPRESSION

[75] Inventor: Donald E. Pezzolo, Cupertino, Calif.

[73] Assignee: Fairchild Camera and Instrument Corporation, Mountain View, Calif.

[22] Filed: Feb. 8, 1974

[21] Appl. No.: 440,929

[52] U.S. Cl. .............. 307/288; 307/255; 307/299 B

[51] Int. Cl.$^2$ .............. H03K 3/26

[58] Field of Search .............. 307/255, 288, 299 B

[56] References Cited

UNITED STATES PATENTS

| | | | |
|---|---|---|---|
| 3,319,086 | 5/1967 | Yee | 307/288 |
| 3,374,366 | 3/1968 | Kleinberg | 307/288 |
| 3,700,921 | 10/1972 | Gay | 307/288 |
| 3,725,683 | 4/1973 | Andersen | 307/299 B |
| 3,818,462 | 6/1974 | Anselmo et al. | 307/299 B |

*Primary Examiner*—Stanley D. Miller, Jr.
*Attorney, Agent, or Firm*—J. Ronald Richbourg; Alan H. MacPherson

[57] ABSTRACT

A latch circuit with noise suppression which comprises a first transistor having at least two collector regions, one of which is coupled as a feedback to the base region of the first transistor, and the second of which is coupled to the base region of a second transistor. The collector region of the second transistor is coupled to the base region of the first transistor, the emitter region of the first transistor is coupled to a voltage source, and the emitter region of the second transistor is coupled to a reference, or ground potential. Miller effect capacitance is employed at the base of the second transistor for suppressing noise pulses produced by the voltage supply to prevent turning on the latch circuit erroneously.

8 Claims, 5 Drawing Figures

LATCH CIRCUIT WITH NOISE SUPPRESSION

BACKGROUND OF THE INVENTION

1. Field of the Invention

This invention relates to latch circuits and, in particular, to a latch circuit with noise suppression characteristics.

2. Description of the Prior Art

Noise suppression circuits have been developed in the past, and such circuits are used in a variety of applications including, for example, automotive circuits and camera circuits. That is, noise suppression circuits are normally employed in circuits where noise pulses are prevalent and spurious operation of the equipment may result. Prior art noise suppression circuits comprise a means for shorting the noise pulses to ground potential, or some other form of circuit means for suppressing the noise pulses, which eliminates spurious operation of the equipment. When such noise suppression circuits are employed with, for example, a latch or switching circuit, additional circuit components normally are required to accomplish noise suppression.

The circuit of this invention is capable of being implemented by the use of monolithic semiconductor integrated circuit techniques, which techniques provide for a reduction in the number of circuit components required to suppress noise.

SUMMARY OF THE INVENTION

In accordance with this invention, a first transistor is provided having at least two collector regions, a base region, and an emitter region coupled to a voltage source. A second transistor is provided having a base region, an emitter region coupled to a reference potential, and a collector region which is coupled to the base region of the first transistor. Means are provided for coupling one of the two collector regions of the first transistor to the base region of the second transistor; for coupling the base region of the second transistor to the reference potential, and for coupling the second of the collector regions of the first transistor to the base region of the first transistor.

This invention provides a circuit having a low and constant gain resulting from a negative current feedback. This current feedback is provided by the connection of one of the collector regions of the first transistor to the base region of the first transistor. The result accomplished by the negative current feedback is that noise sensitivity is a beta function rather than a beta$^2$ function as in present designs.

Another advantage of this invention is that the base-collector capacitance of the second transistor of the latch circuit is multiplied by the voltage gain of the second transistor, thereby reducing the bandwidth of the latch circuit for suppressing noise.

Still another advantage of the circuit of this invention is that lower supply voltages may be employed for the latch circuit without spurious operation resulting from power supply transient voltages.

DETAILED DESCRIPTION

Figure 1:
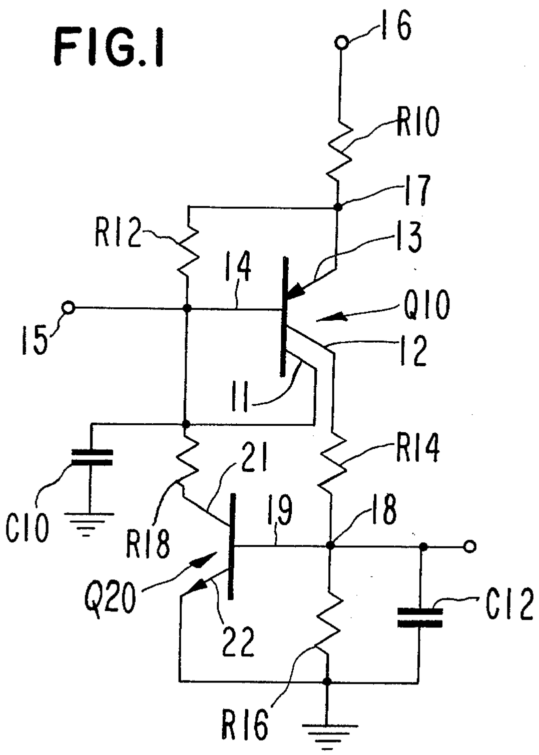
FIG. 1 is a schematic diagram of one embodiment of the latch circuit of this invention.

A PNP transistor Q10 is illustrated schematically in FIG. 1, which has two collector regions 11 and 12, an emitter region 13, and a base region 14. The base region 14 is coupled to input terminal 15 of the latch circuit; however, the input to the latch circuit may be coupled to other points of the circuit as will be described hereinafter. A resistor R10 is connected between a source of voltage supplied on terminal 16 and a circuit point 17, and the emitter region 13 of the transistor Q10 is coupled to the same circuit point 17. Resistor R12 is coupled between the circuit point 17 and the base region 14. The second collector region 11, which comprises a means for current feedback, is coupled to the base region 14.

A resistor R14 is coupled between the first collector region 12 and a circuit point 18. Base region 19 of a transistor Q20 is coupled to the circuit point 18. Collector region 21 of the transistor Q20 is coupled to the junction between base region 14 and collector region 11. An emitter region 22 of the transistor Q20 is coupled to a reference, or ground, potential. A resistor R16 is coupled between circuit point 18 and the reference, or ground, potential.

A capacitance, which is designated in FIG. 1 as capacitor C10, is coupled between the base region 14 of transistor Q10 and ground potential. This capacitance is formed from a combination of the normal base-to-ground capacitance of transistor Q10, and the normal collector-to-ground capacitance of transistor Q20. A capacitance which is derived by the Miller effect and is designated as capacitor C12, is effectively coupled across resistor R16. The Miller effect capacitance C12 comprises the base-to-collector capacitance of transistor Q20 multiplied by the voltage gain of transistor Q20.

The exemplary latch circuit illustrated in FIG. 1 will turn ON and produce an output signal at, for example, circuit point 18 in response to a low level signal supplied on input terminal 15. The input to, and the output from, the latch circuit can be coupled to other points in the circuit than the specific ones illustrated. For example, a high level input signal may be supplied to circuit point 18, and the output signal could be derived from circuit point 17. Those skilled in the art may select other input and output terminals, and it is therefore understood that the circuits illustrated and described in this application are exemplary only.

When the latch circuit is in the OFF state, a voltage spike appearing on supply terminal 16 would normally change the circuit to the ON state. However, by the use of the collector-to-base feedback (i.e., collector 11 coupled to base 14) the gain of transistor Q10 is limited, and sensitivity to voltage transients on terminal 16 is mitigated.

The Miller capacitance, as represented by capacitor C12, co-acting with resistors R14 and R16 integrate the supply voltage transients and prevents the latch circuit from turning on spuriously.

A resistor R18 (shown in FIG. 1 by dashed lines) can be added in series between base region 14 of transistor Q10 and collector region 21 of transistor Q20 to effect an increase in the voltage gain of the circuit. Such a voltage gain will concomitantly increase the Miller capacitance C12, and thereby increase the degree of integration of the voltage transients.

Figure 1A:
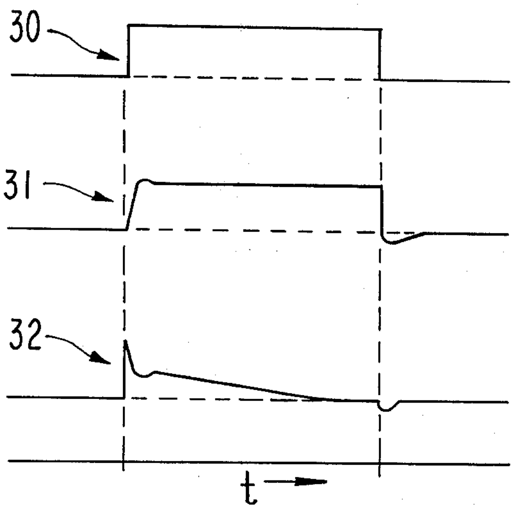
FIG. 1*a* is a timing diagram for the circuit shown in FIG. 1.

The operation of the circuit illustrated in FIG. 1 is exemplified by the timing diagram illustrated in FIG. 1a. Waveform 30 represents a voltage transient appearing on terminal 16. Waveform 31 represents the signal appearing at the collector region 11 in response to the voltage transient (waveform 30) appearing on terminal 16. Waveform 32 represents the signal appearing at the circuit point 18 in response to the same voltage transient (waveform 30). Accordingly, the latch circuit will not turn ON in response to a voltage transient similar to that depicted by waveform 30, appearing on the voltage supply terminal 16.

Figure 2:
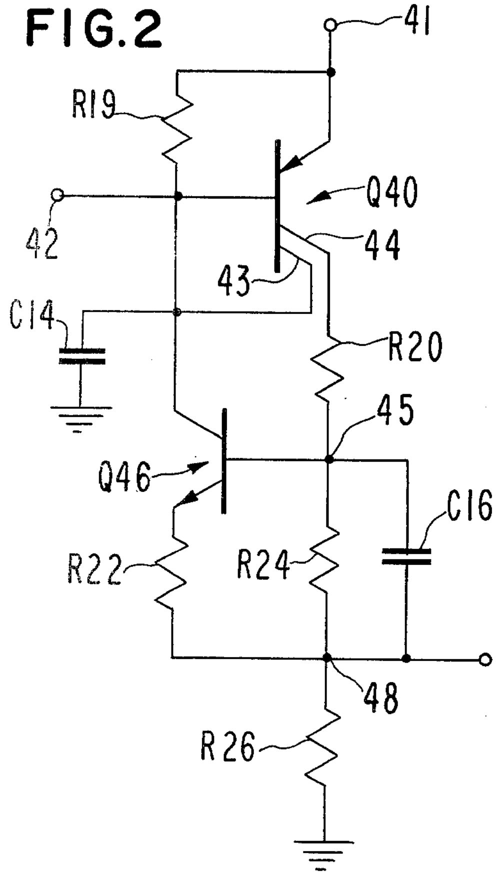
FIG. 2 is a schematic diagram of another embodiment of the latch circuit of this invention.

Another embodiment of this invention is illustrated schematically in FIG. 2. A first transistor Q40 has an emitter region coupled to a voltage supply terminal 41. The base region of transistor Q40 is coupled to an input terminal 42. A resistor R19 is coupled between the base region of Q40 and the voltage supply terminal 41. The collector region 43 of Q40 is coupled to the base region of Q40, and a second collector region 44 is coupled to one side of a resistor R20. The second side of the resistor R20 is coupled to a circuit point 45. The base region of a second transistor Q46 is coupled to the circuit point 45, and the collector region Q46 is coupled to the base region of Q40. A resistor R22 is coupled between the emitter region of transistor Q46 and a circuit point 48. A resistor R24 is coupled between circuit points 45 and 48, and resistor R26 is coupled between the circuit point 48 and ground potential.

A capacitance, designated in FIG. 2 as capacitor C14, is formed between the collector region 43 and ground potential. The capacitance forming capacitor C14 is an inherent characteristic of a transistor within an integrated circuit, and comprises the capacitance between the collector region 43 and the underlying substrate. A capacitance, which is derived by the Miller effect (as described above for C12 FIG. 1) and is designated as capacitor C16, is effectively coupled across resistor R24.

The circuit shown in FIG. 2 differs primarily from the circuit shown in FIG. 1 by the addition of resistors R22 and R26 coupled between the emitter of Q46 and ground potential. Also, the voltage supply transistor R10 (FIG. 1) has been omitted from the circuit shown in FIG. 2. The output signal developed across load resistor R26 (FIG. 2) is a constant current independent of the voltage supplied on terminal 41, whereas the current at circuit point 18 (FIG. 1) is variable as a result of base-emitter current of transistor Q20.

Figure 2A:
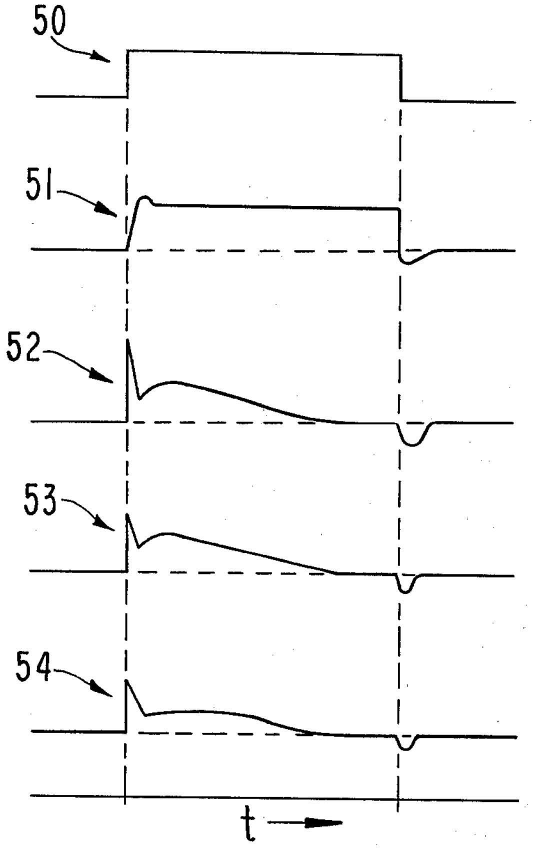
FIG. 2*a* is a timing diagram for the circuit shown in FIG. 2.

The operation of the circuit shown in FIG. 2 is exemplified by the timing diagram illustrated in FIG. 2*a*. Waveform 50 represents a voltage transient appearing on voltage supply terminal 4l. A signal appears on the base region of transistor Q40, in response to the voltage transient (waveform 50), and this signal is represented by waveform 51. The latch circuit will not turn ON since transistor Q40 is a PNP transistor and requires a negative signal for operation. Other signals appearing on the collector region 44 and at circuit point 45 are depicted by waveforms 52 and 53, respectively. The signal which appears at circuit point 48 in response to the voltage transient (waveform 50) is depicted by waveform 54. The signal appearing at the base region of transistor Q46 (waveform 53) is not of sufficient magnitude to turn Q46 ON, and hence the latch circuit will not turn ON.

Figure 3:
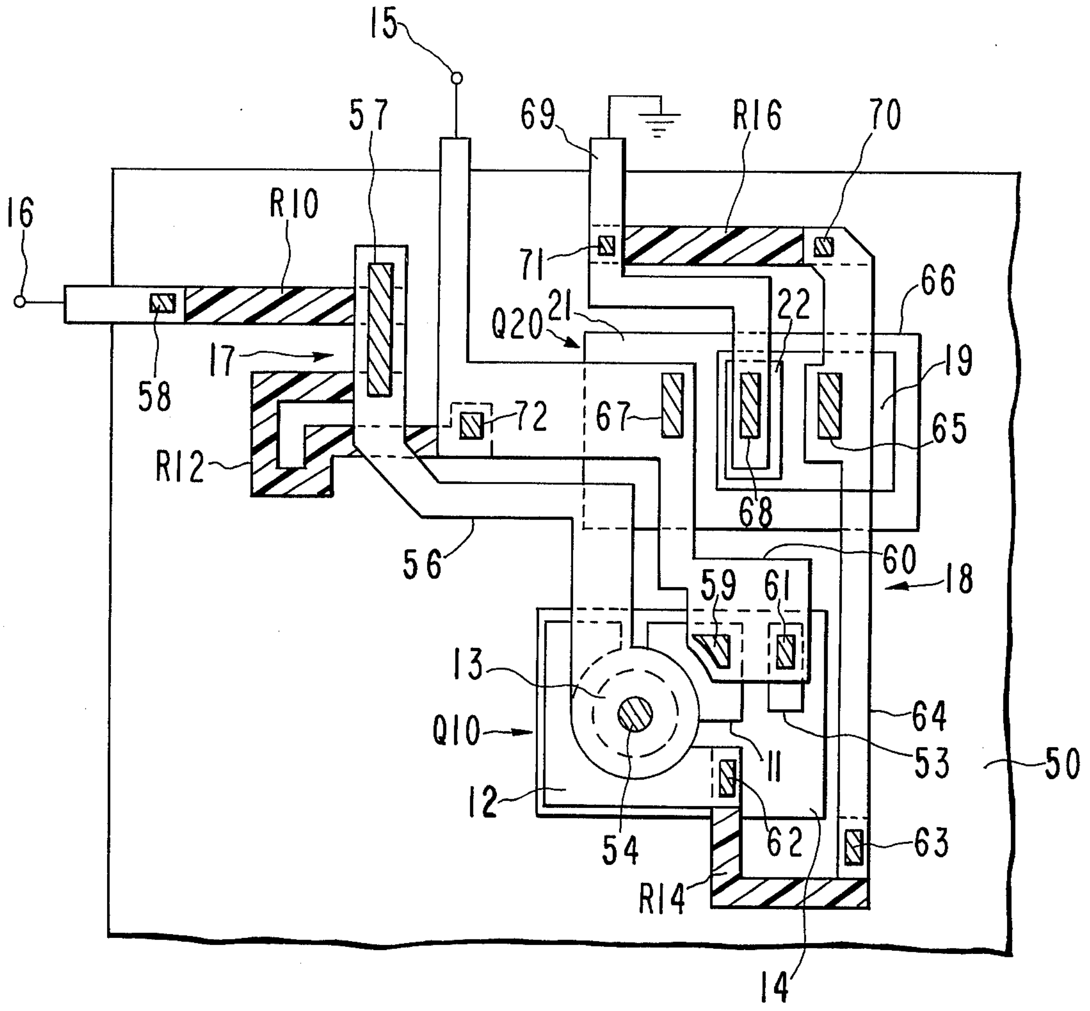
FIG. 3 is a top view of one embodiment of the circuit of this invention in integrated circuit form.

Referring now to FIG. 3, the circuit illustrated in FIG. 1 is shown in the form of a monolithic integrated circuit. The circuit is built upon a pocket 50 of *n* type material formed over a *p* type substrate (not shown). The area of the pocket 50, wherein the transistor Q10 is formed, is electrically isolated from adjacent regions of the pocket by the formation of a diffused isolation wall 52. The entire area enclosed within the wall 52 is of n type material and constitutes the base region 14 of the transistor Q10. A surface contact 53 is formed over the base region 14 to effect an electrical connection. A p type material is diffused within the n type material of the base region 14 for forming the emitter region 13, which has a circular shape. Collector regions 11 and 12 are also formed by diffusing a p type material into the base region 14. As may be seen in FIG. 3, collector regions 11 and 12 have curved edges concentric with the circular shaped emitter region 13. These transistors are normally called "lateral transistors" because both their emitter and collectors are formed in a common base.

Emitter region 13 is connected to the voltage input terminal 16 by means of contact 54, overlying conductor 56, contact 57 at circuit point 17, resistor R10, and contact 58. Collector region 11 is connected to the base region 14 by means of contact 59, overlying conductor 60, and contacts 61 and 53. Collector region 11 and base region 14 are connected to the input terminal 15 by means of contacts 59 and 61, respectively, and overlying conductor 60. Collector region 12 is connected to the base region 19 of transistor Q20 by means of contact 62, R14, contact 63, overlying conductor 64, and contact 65. Overlying conductor 64 constitutes circuit point 18 (FIG. 1).

Transistor Q20 is formed within the pocket 50 in a manner similar to that described above for transistor Q10. The area of the pocket, wherein Q20 is formed, is electrically isolated from adjacent regions of the pocket by the formation of diffused isolation wall 66. The total area enclosed by wall 66 is of n type material and constitutes the collector region 21 of the transistor Q20. A p type impurity is diffused into the n type region 21 for forming the base region 19. Contact 65 forms an electrical connection with region 19. An n type impurity is diffused into base region 19 for forming the emitter region 22 of transistor Q20. The collector region 21 of transistor Q20 is connected to the base region 14 of transistor Q10 by means of contact 67, overlying conductor 60, and contacts 61 and 53. The emitter region 22 of transistor Q20 is connected to ground potential by means of contact 68 and overlying conductor 69. Resistor R16 is connected between circuit point 18 and ground potential by means of contacts 70 and 71.

Resistor R12 is connected between circuit point 17 and the base region 14 of transistor Q10 by means of contact 57 and contact 72. Resistors R10, R12, R14, and R16 are formed by diffusing a p type material into the n type pocket 50.

As may be seen in FIG. 3, the curved edges of collector regions 11 and 12 are concentrically disposed about the circular emitter region 13, which receive current from the emitter. A majority of the current from the emitter is received along these curved edges of the two collectors, and current received in other portions of the collectors is negligible. The curved-edge lengths of the collector regions 11 and 12 determine the current receiving capacity of the respective collectors, and the relative lengths of the curved edges are determinative of the actual beta of transistor Q10. In particular, the actual closed-loop beta may be expressed by the following equation:

$$\beta_A = \frac{\beta C_o}{C_f(1+\beta)+C_o}$$

where $\beta$ = open loop beta of transistor Q10 (i.e., beta without a feedback loop), $C_o$ = the ratio of the curved-edge length of the collector region 12 to the total curved edge length of collectors 11 and 12, $C_f$ = the ratio of the curved-edge length of collector region 11 to the total curved-edge length of the collector. In one example of the circuit shown in FIGS. 1 and 3, the curved-edge lengths of the collector regions were chosen such that the actual beta $\beta_A$ was equal to 1.5 while the real $\beta$ varied in value from 2 to 100. This reduced the positive feedback gain of transistor Q10, and thereby stabilized the latch circuit for temperature and process variations.

What is claimed is:

1. Circuits which comprises:

a. a first transistor of a first conductivity type having at least two collector regions, a base region, and an emitter region coupled to a voltage source;

b. a second transistor of a conductivity type opposite from that of said first transistor having a base region, an emitter region coupled to a reference potential, and a collector region coupled to said base region of said first transistor;

c. a resistive means coupling said base region of said second transistor to a first of said at least two collector regions;

d. capacitive means coupling said base region of said second transistor to said reference potential, said resistive means and said capacitive means co-act to suppress the amplitude of voltage transients; and, e. means coupling a second one of said at least two collector regions to said base region of said transistor.

2. A circuit as defined in claim 1, including resistive means coupled between said base region of said first transistor and said collector region of said second transistor for increasing the voltage gain of said second transistor so that the capacitance of said capacitive means increases, thereby improving the suppression of voltage amplitude transients.

3. A circuit as defined in claim 1 wherein the size of said first collector is larger than the size of said second collector, and the actual closed-loop beta of said first transistor is defined as:

$$\beta_A = \frac{\beta C_o}{C_f(1+\beta)+C_o},$$

wherein $\beta$ is defined as the open-loop beta of said first transistor, $C_o$ is defined as the ratio of the size of said first collector to the total size of said first and said second collectors, and $C_f$ is defined as the ratio of the size of said second collector to the total size of said first and said second transistors, whereby the positive feedback gain of said first transistor.

4. A circuit as defined in claim 1 further including a resistive element coupling the base region of said first transistor to the emitter region of said first transistor.

5. A circuit as defined in claim 4 further including a resistive element coupled in parallel with said capacitive means.

6. A circuit as defined in claim 1 wherein the input of said circuit is coupled to the base region of said second transistor.

7. A circuit as defined in claim 1 wherein a resistive element is coupled between the emitter region of said second transistor and said reference potential for providing a constant current load independent of variations in said voltage source.

8. A circuit as defined in claim 1 wherein a resistive element is coupled between the collector region of said second transistor and the base region of said first transistor for increasing the gain of said circuit.

* * * * *